(12) United States Patent
Jeong et al.

(10) Patent No.: US 7,897,519 B2
(45) Date of Patent: Mar. 1, 2011

(54) COMPOSITION AND ORGANIC INSULATOR PREPARED USING THE SAME

(75) Inventors: Eun Jeong Jeong, Seongnam-si (KR); Joo Young Kim, Suwon-si (KR); Kyung Seok Son, Seoul (KR); Eun Kyung Lee, Seoul (KR); Sang Yoon Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 171 days.

(21) Appl. No.: 11/808,463

(22) Filed: Jun. 11, 2007

(65) Prior Publication Data

US 2008/0111129 A1 May 15, 2008

(30) Foreign Application Priority Data

Nov. 13, 2006 (KR) .................. 10-2006-0111601

(51) Int. Cl.
*H01L 21/31* (2006.01)

(52) U.S. Cl. ........... 438/780; 438/781; 438/790; 257/41; 257/E51.001; 257/E51.027; 427/384; 427/419.5

(58) Field of Classification Search .................. 247/384, 247/419.5; 528/34; 525/477; 438/780, 781, 438/790; 257/41, E51.027, E51.001; 427/384, 427/419.5

See application file for complete search history.

(56) References Cited

U.S. PATENT DOCUMENTS

| | | | |
|---|---|---|---|
| 5,347,114 A | 9/1994 | Tanaka | |
| 5,946,551 A | 8/1999 | Dimitrakopoulos et al. | |
| 5,981,970 A | 11/1999 | Dimitrakopoulos et al. | |
| 6,232,157 B1 | 5/2001 | Dodabalapur et al. | |
| 6,586,791 B1 | 7/2003 | Lee et al. | |
| 6,791,649 B1 * | 9/2004 | Nakamura et al. | 349/137 |
| 2003/0134222 A1 * | 7/2003 | Lee et al. | 430/191 |
| 2005/0170284 A1 * | 8/2005 | Lee et al. | 430/270.1 |
| 2007/0129473 A1 * | 6/2007 | Shin et al. | 524/261 |
| 2008/0027203 A1 * | 1/2008 | Dams | 528/42 |

OTHER PUBLICATIONS

Y.Y. Lin et al. "High Mobility Pentacene Organic Thin Film Transistors". Electronic Materials and Processing Research Laboratory, pp. 80-81. 54th Annual Device Research Conference Digest 1996.

Carmen Bartic et al. "$Ta_2O_5$ as gate dielectric material for low-voltage organic thin-film transistors". Organic Electronics 3, 65-72. 2002.

C. D. Dimitrakopoulos et al. "Low-Voltage Organic Transistors on Plastic Comprising High-Dielectric Constant Gate Insulators". Science vol. 283, pp. 822-824. Feb. 5, 1999.

* cited by examiner

*Primary Examiner* — Hsien-ming Lee

(74) *Attorney, Agent, or Firm* — Harness, Dickey & Pierce, P.L.C.

(57) ABSTRACT

Disclosed is a composition for preparing an organic insulator, including an organic silane material, having a vinyl group, an acetylene group or an acryl group as a functional group for participating in a crosslinking reaction, a crosslinking agent, and a solvent for dissolving the above components. The organic insulator of example embodiments may be provided in the form of a solid insulating film, which may increase charge mobility while decreasing the threshold voltage and operating voltage of OTFTs, and which also may generate relatively slight hysteresis.

12 Claims, 7 Drawing Sheets

MVTS/DPHA

PVTS/DPHA

TPM/Ti(BuOH)4

_US 7,897,519 B2_

COMPOSITION AND ORGANIC INSULATOR PREPARED USING THE SAME

PRIORITY STATEMENT

This non-provisional application claims priority under U.S.C. §119(a) to Korean Patent Application No. 2006-111601, filed on Nov. 13, 2006, in the Korean Intellectual Property Office (KIPO), the entire contents of which are incorporated herein by reference.

BACKGROUND

1. Field

Example embodiments relate to a composition for preparing an organic insulator having a crosslinking property, an organic insulator prepared using the same, an organic thin film transistor (OTFT) including the organic insulator, an electronic device including the OTFT and methods of fabricating the same. Other example embodiments relate to a composition for preparing an organic insulator, comprising an organic silane material, a crosslinking agent, and a solvent, an organic insulator prepared using the same, an organic thin film transistor (OTFT) including the organic insulator, an electronic device including the OTFT and methods of fabricating the same.

2. Description of the Related Art

A thin film transistor (TFT), which is primarily used in display devices, may be composed mainly of an amorphous silicon semiconductor, a silicon oxide insulating film, and metal electrodes. To further the diversification of material, an organic thin film transistor (OTFT) using an organic semiconductor has been developed, and has been studied with regard to its applicability. Because the OTFT is flexible and is relatively easy to manufacture, its application to the display field has been accelerated.

Typically, after the development of polyacetylene, which is a conjugated organic polymer having semiconductor properties, organic semiconductors have received attention as an electric and electronic material due to the advantages of organic material, for example, the variety of synthesis methods, relatively easy formability into fibers and films, flexibility, conductivity, and decreased preparation costs, and thus have been studied in the field of functional electronic devices and optical devices. Among devices using such a conductive polymer, research into OTFTs using organic material as an active layer is being conducted. The OTFT may have a structure very similar to a conventional Si-TFT, with the exception that the semiconductor region thereof is formed using an organic material, instead of Si. Such OTFTs are advantageous because a semiconductor layer may be prepared through a printing process under atmospheric pressure, rather than a plasma-enhanced chemical vapor deposition process, which is the conventional silicon process, and because it is possible to perform a roll-to-roll process using a plastic substrate, thereby decreasing the cost of fabricating the transistor.

Further, the OTFTs have charge mobility equal to or higher than amorphous Si-TFTs, but their operating voltage and threshold voltage may be relatively high. Where pentacene is used along with amorphous silicon ($SiO_2$), charge mobility may be realized to the level of about 0.6 $cm^2$/V·sec, suitable for actual use. However, an operating voltage of about 100 V or more and a sub threshold voltage about 50 times higher than in the case of amorphous silicon are undesirably required. Among the properties of TFTs, in order to control the operating voltage and decrease the sub threshold voltage, various attempts have been made to apply an insulating film having a high dielectric constant (high k) to OTFTs, as well as Si-TFTs. For example, the use of a ferroelectric insulator, including $Ba_xSr_{1-x}TiO_3$ (BST), $Ta_2O_5$, $Y_2O_3$, and $TiO_2$, and an inorganic insulating film with a dielectric constant of about 15 or more, including $PbZr_xTi_{1-x}O_3$ (PZT), $Bi_4Ti_3O_{12}$, $BaMgF_4$, $SrBi_2(Ta_{1-x}Nb_x)_2O_9$, $Ba(Zr_{1-x}Ti_x)O_3$ (BZT), $BaTiO_3$, $SrTiO_3$, and $Bi_4Ti_3O_{12}$, has been disclosed. In the devices using the above-mentioned material, the insulating materials are applied using a deposition process (e.g., CVD, sputtering and/or ALD) or a sol-gel process, and the properties of the device, having a charge mobility of about 0.6 $cm^2$/V·sec or less and threshold voltage of about −5 V or less, have been reported. However, because most of the device fabrication process is performed at increased temperatures (about 200° C.~about 400° C.), the use of various substrates may be restricted, and applying a printing process may be difficult. Although an organic insulating film using polyimide, BCB (BenzoCycloButene) or photoacryl has been proposed, the device properties exhibited may not be desirable to the extent of substituting for inorganic insulating films.

While the OTFT is applied not only to LCDs but also to devices for driving flexible displays using organic EL, a charge mobility of about 10 $cm^2$/V·sec or more is required. In the manufacturing process, methods using an all-printing process or an all-spin-on process on a plastic substrate are being studied. Research is being directed toward an organic insulator in which conditions favorable for forming an organic active layer are provided, along with a relatively simple preparation process, to thus enlarge the grain size of the organic active layer, resulting in increased charge mobility, upon application to devices in place of inorganic insulating films. There are reports of charge mobility of about 1~5 $cm^2$/V·sec. However, such organic insulating films generally have a dielectric constant of about 3~4 and require an increased operating voltage (about 30 V~about 50 V) and threshold voltage (about 15 V~about 20 V).

With the goal of increasing the dielectric constant of the organic insulator, a method of dispersing nano-sized ferroelectric ceramic particles in an insulating polymer is disclosed in the related art. However, the above method is undesirable because the ceramic particles negatively affect the formation of the organic active layer, and thus charge mobility may be decreased, and also leakage current may be increased, undesirably causing problems in which the above material should be provided in the form of a double structure along with an organic material having improved insulating properties.

In addition, upon the fabrication of OTFT devices, a multilayered structure and pattern may be formed using organic and inorganic materials. In FIG. 1, a conventional organic thin film transistor may include a gate electrode 2 formed on a substrate 1, and an insulating film 3, source/drain electrodes 4,5 and a semiconductor layer 6 are formed thereon. As such, there is a need for an insulating layer which is present as a crosslinked dense film so as to be resistant to chemicals and process conditions in the subsequent processing of the insulating film. For example, an insulator having an improved crosslinking property needs to be realized. However, a conventional crosslinking agent, mainly used for crosslinking the silane resins, may function to form a chemical bond between Si—OH groups or to chemically bind to Si—OH, and limitations may be thus imposed on increasing the crosslinking property.

SUMMARY

Accordingly, example embodiments have been made keeping in mind the above problems occurring in the related art, and example embodiments provide a composition for preparing an organic insulator, which has an increased crosslinking property in order to prepare an organic insulator that generates only slight hysteresis and is not deteriorated by, but is stable to, chemicals in the course of processing and an organic insulator including the composition. Example embodiments provide an OTFT including the above organic insulator and an electronic device including the OTFT.

Example embodiments provide a method of preparing an organic insulator, comprising applying the above composition on a substrate and then curing the substrate. Example embodiments also provide a method of fabricating an OTFT including preparing the organic insulator according to example embodiments and a method of fabricating an electronic device including the method of fabricating the OTFT.

Example embodiments provide a composition for preparing an organic insulator, comprising an organic silane material having a vinyl group, an acetylene group or an acryl group as a functional group for participating in a crosslinking reaction, a crosslinking agent, and a solvent for dissolving the above components.

BRIEF DESCRIPTION OF THE DRAWINGS

Example embodiments will be more clearly understood from the following detailed description taken in conjunction with the accompanying drawings.

FIG. 1 is a sectional view illustrating the structure of a conventional TFT;

FIGS. 2 and 3 are schematic views illustrating the chemical structure of the organic silane compounds used in Examples 1 and 3;

FIGS. 4 and 5 are the NMR spectra (29Si NMR (400 MHz)) of the organic silane compounds obtained in Preparative Examples 1 and 3;

FIGS. 6 to 8 are graphs illustrating the current transfer properties of the OTFTs fabricated in Examples 1 to 3; and FIG. 9 is a graph illustrating the current transfer properties of the OTFT fabricated in Comparative Example 1.

Figure 1:
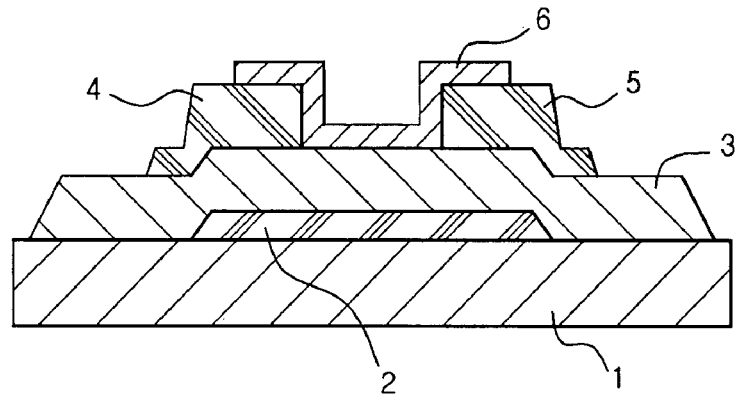
FIGS. 1-9 represent non-limiting, example embodiments as described herein.

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

Example embodiments will now be described in greater detail with reference to the accompanying drawings. In the drawings, the thicknesses and widths of layers are exaggerated for clarity. Example embodiments may, however, be embodied in many different forms and should not be construed as limited to the example embodiments set forth herein. Rather, these example embodiments are provided so that this disclosure will be thorough and complete, and will fully convey the scope of example embodiments to those skilled in the art.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

According to example embodiments, the composition for preparing an organic insulator is provided, comprising an organic silane material having a vinyl group, an acetylene group or an acryl group as a functional group for participating in a crosslinking reaction, a crosslinking agent, and a solvent for dissolving the above components.

The organic silane material may be a material obtained by hydrolyzing and condensing at least one organic silane compound alone or mixtures thereof, selected from the group consisting of compounds represented by Formulas 1 to 3 below:

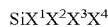  Formula 1

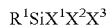  Formula 2

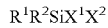  Formula 3 in Formulas 1 to 3, $R^1$ and $R^2$ are each independently a hydrogen atom; a $C_{1-10}$ alkyl group; a $C_{3-10}$ cycloalkyl group; a $C_{6-15}$ aryl group; a $C_{2-30}$ alkyl group or a cycloalkyl group substituted with an acryloyl group, an acryloyloxy group or an epoxy group; a vinyl group; an allyl group; an acryloyloxy group; an epoxy group; or a $C_{1-10}$ alkoxy group, at least one of which includes a vinyl group, an acetylene group or an acryl group, and $X^1$, $X^2$, $X^3$ and $X^4$ are each independently a halogen atom or a $C_{1-10}$ alkoxy group, at least one of which is a hydrolysable functional group.

In example embodiments, the material obtained through hydrolysis and condensation may be a siloxane compound obtained by hydrolyzing and condensing at least one selected from among the compounds of Formulas 1 to 3 in the presence of an acid or base catalyst.

The acid or base catalyst used in the preparation of the siloxane compound may be one or more selected from the group consisting of hydrochloric acid, nitric acid, benzene sulfonic acid, oxalic acid, formic acid, potassium hydroxide, sodium hydroxide, triethylamine, sodium bicarbonate, and pyridine. As such, the molar ratio of the catalyst relative to the total amount of monomer of Formulas 1 to 3 may be set in the range of about 1:0.000001~about 1:10. The molar ratio of water used for the hydrolysis and condensation may be set in the range of about 1:1~about 1:1000 relative to the total amount of monomer of Formulas 1 to 3.

Further, examples of the solvent used may include an aliphatic hydrocarbon solvent, e.g., hexane, an aromatic hydrocarbon solvent, e.g., anisol, mesitylene and/or xylene, a ketone-based solvent, e.g., cyclohexanone, methyl isobutyl ketone, 1-methyl-2-pyrrolidinone and/or acetone, an ether-based solvent, e.g., tetrahydrofuran and/or isopropyl ether, an acetate-based solvent, e.g., ethyl acetate, butyl acetate and/or propyleneglycol methyl ether acetate, an alcohol-based solvent, e.g., isopropyl alcohol and/or butyl alcohol, an amide-based solvent, e.g., dimethylacetamide and/or dimethylformamide, a silicon-based solvent, water, and mixtures thereof.

Alternatively, the composition may be prepared even in the absence of the solvent. The above reaction may be performed at about −100° C.~about 200° C. for about 0.1 hours~about 100 hours. The polymer thus prepared may have a molecular weight ranging from about 300 to about 300,000, but example embodiments may not be limited thereto.

Figure 2:
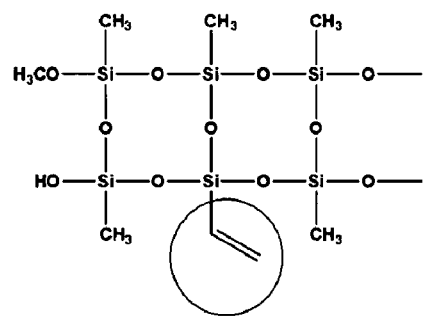
Figure 3:
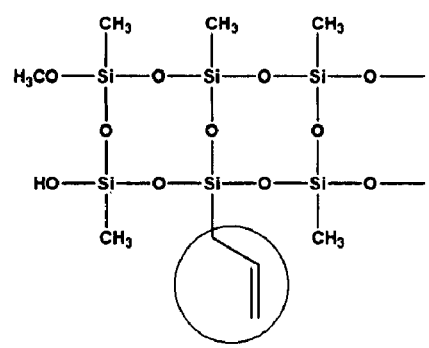
Figure 4:
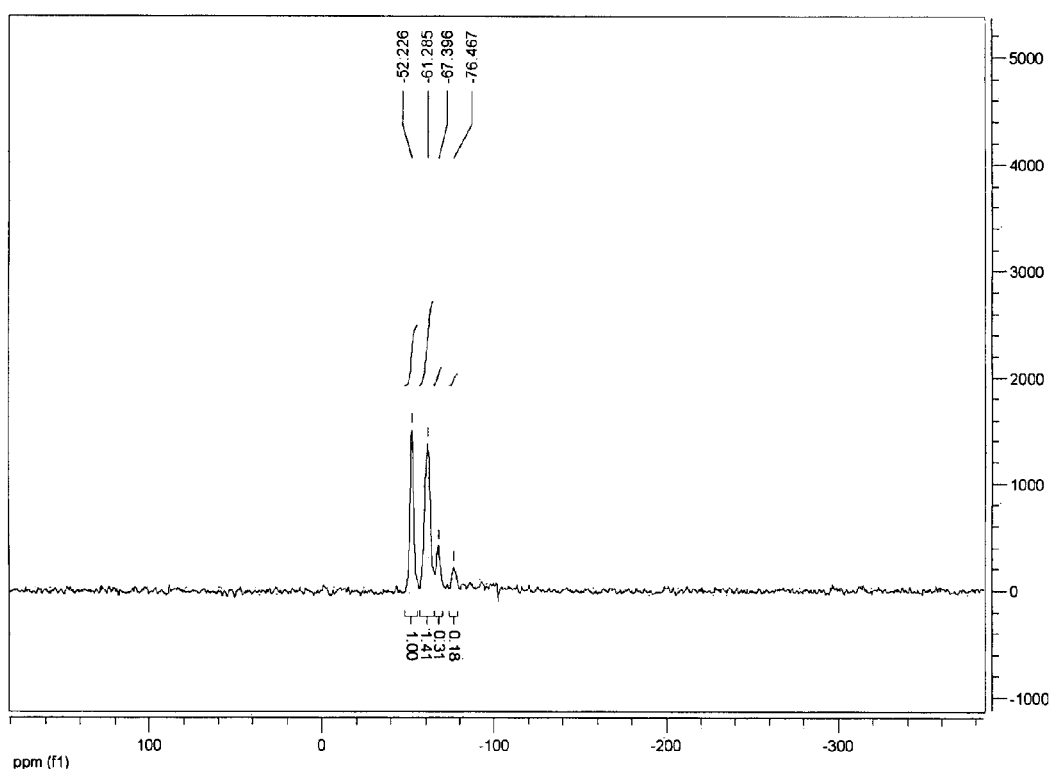
Figure 5:
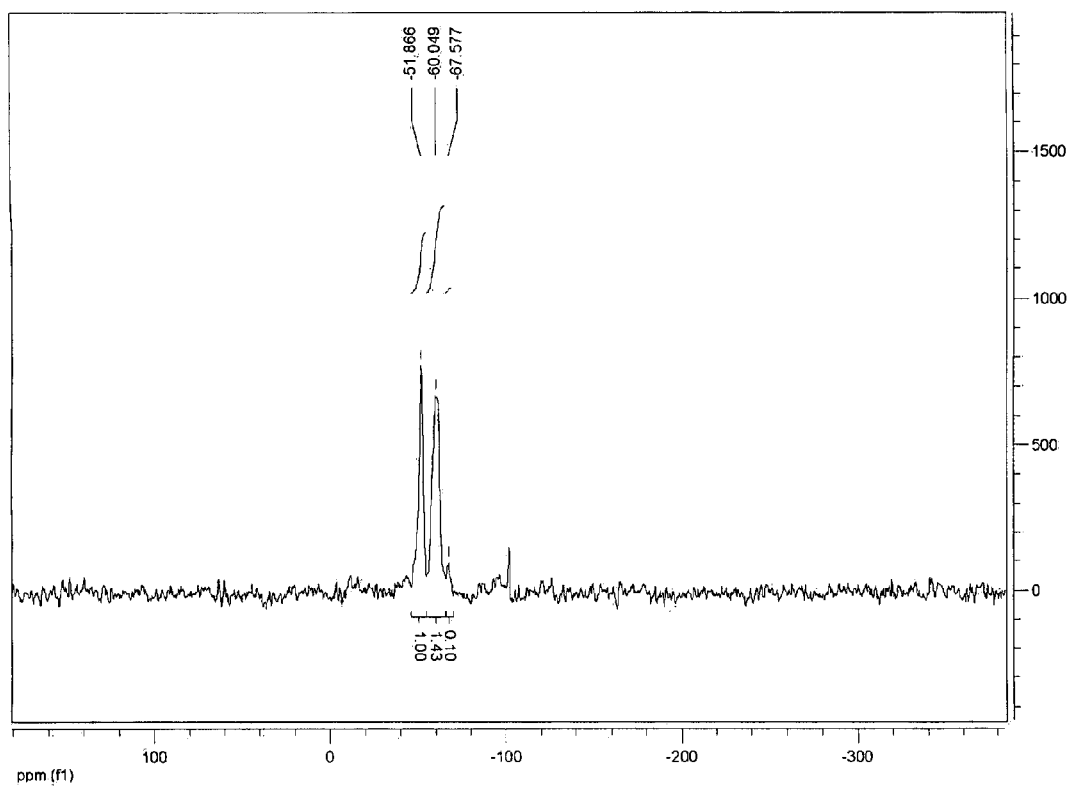
Figure 6:
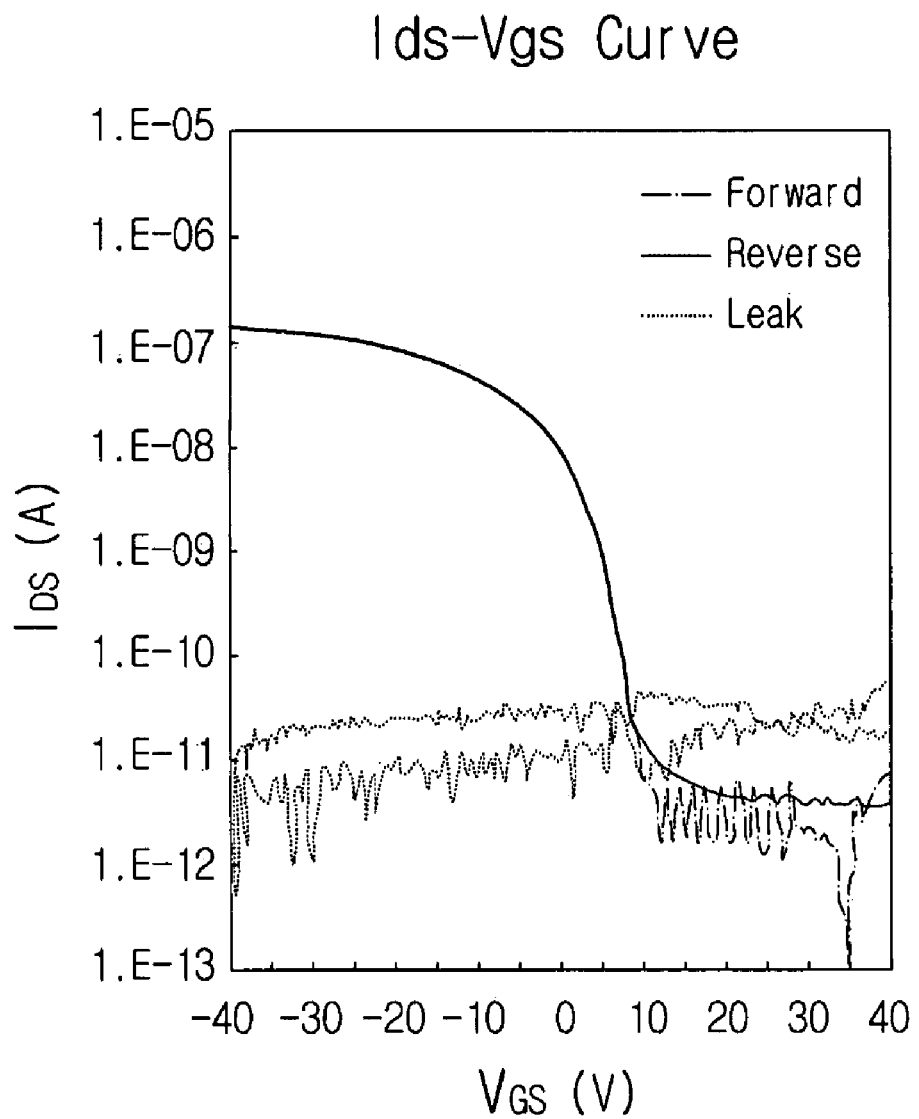
Figure 7:
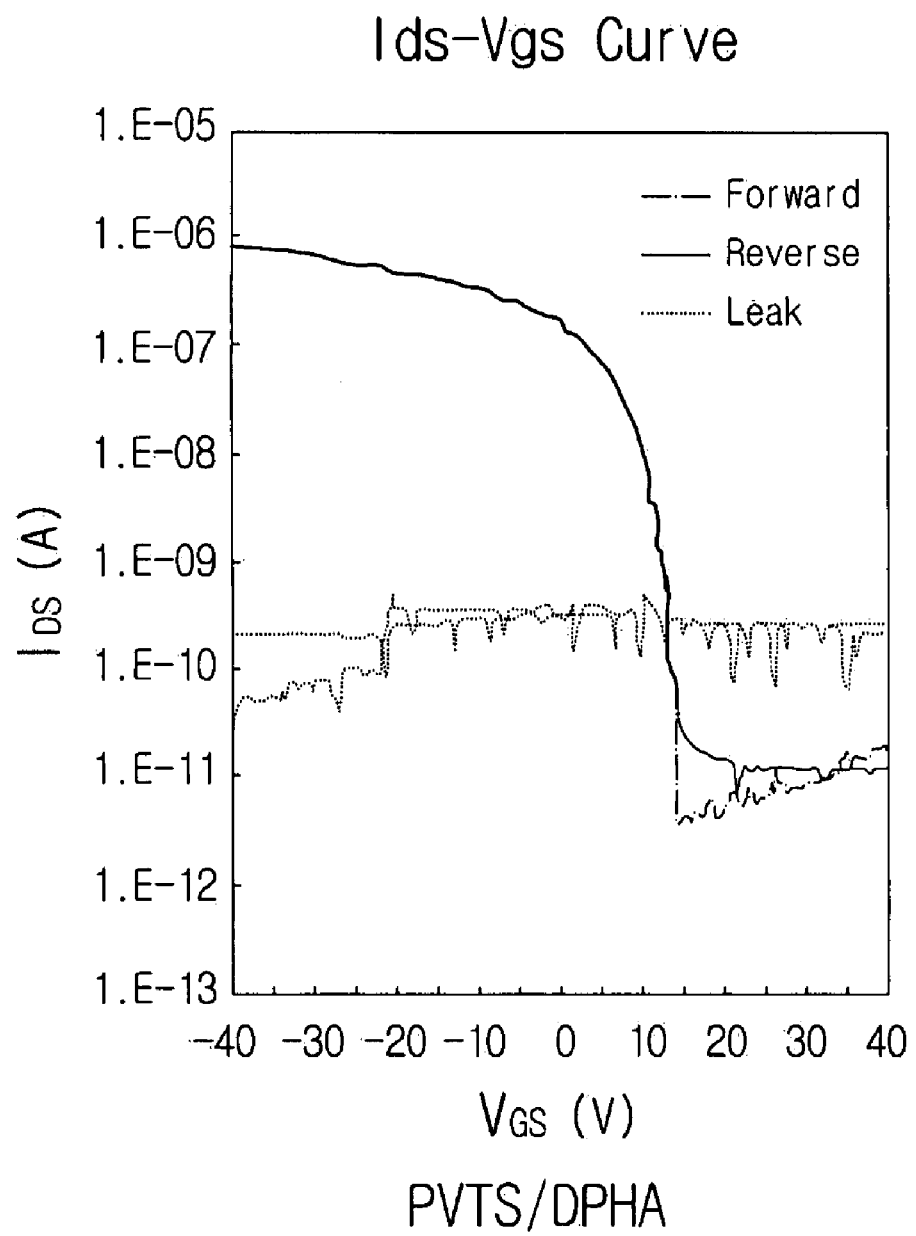
Figure 8:
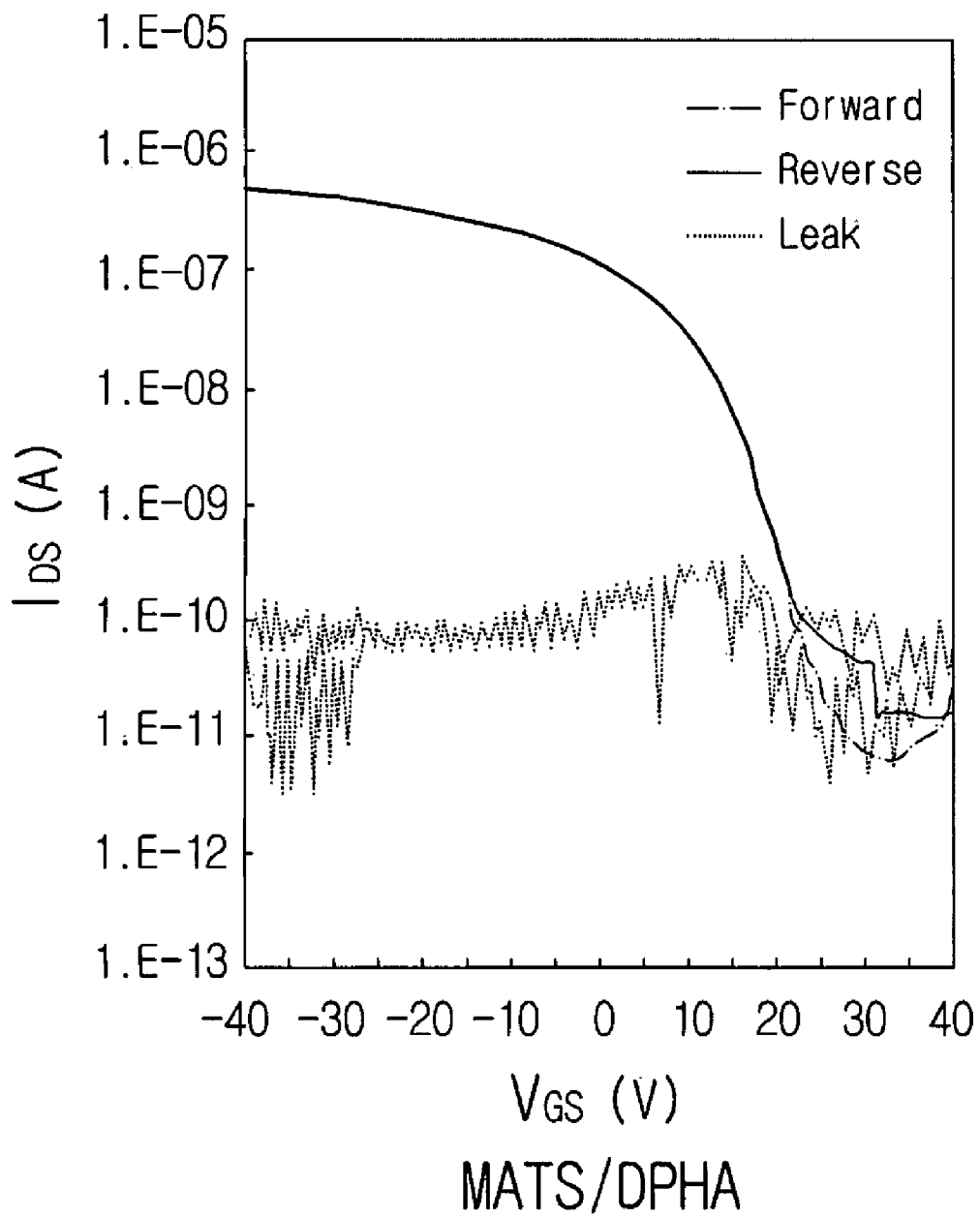
Figure 9:
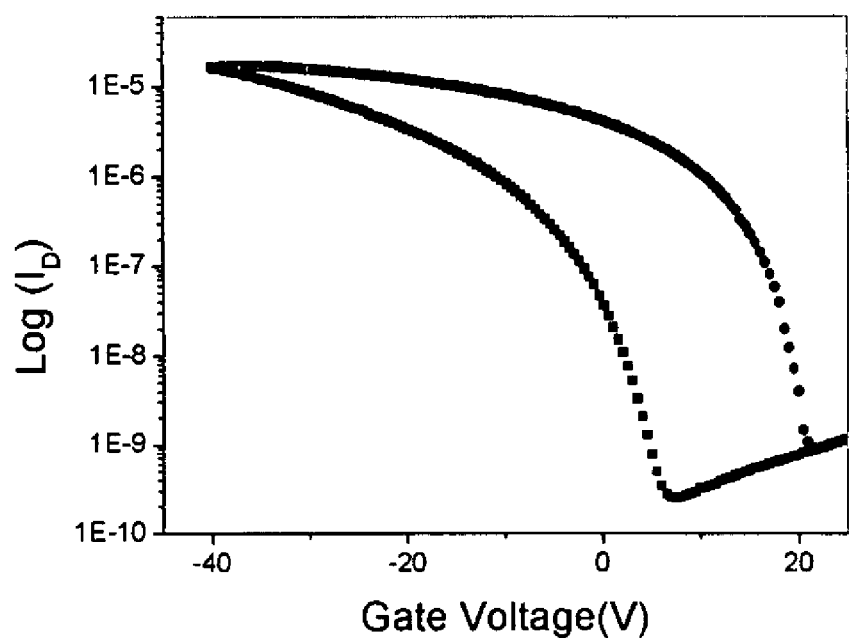

FIGS. 2 and 3 illustrate the chemical structure of the organic silane material obtained by hydrolyzing and condensing at least one selected from among compounds of Formulas 1 to 3 in the presence of an acid or base catalyst. FIGS. 4 and 5 illustrate the spectra of MVTS and MATS of Preparative Examples 1 and 3, measured using NMR spectroscopy (29Si NMR (400 MHz)). The organic silane compound illustrated in FIGS. 2 and 3, resulting from the copolymerization between the monomer of Formula 1 and the monomer of Formula 2 or 3, may have at least one functional group able to participate in a crosslinking reaction, as is apparent from FIGS. 4 and 5. In FIGS. 2 and 3, respectively, a vinyl group and an allyl group may be seen to be introduced as a functional group. Generally, silane resins suitable for use in an organic insulator are composed of hydrocarbon substituents, in which the electrical properties and processibility of the insulating film vary depending on the type of functional group of hydrocarbon. For example, in the case of the silane resin, composed solely of saturated hydrocarbons or partially unsaturated hydrocarbons, only the crosslinking by the Si—OH reaction is unable to obtain a solid insulator having increased chemical resistance. Accordingly, in example embodiments, material having the functional group disclosed in example embodiments may be mixed with the crosslinking agent of Formula 4 or 5, which may be crosslinked therewith, and the solvent, applied in the form of a film through spin coating, and then cured by light or heat, thus preparing a crosslinked film. Thereby, a desired insulator, which causes little hysteresis (a property for a field emission transistor (FET)), and has increased chemical resistance and is solid, may be obtained.

The crosslinking agent of example embodiments may include a compound represented by Formula 4 or 5 below:

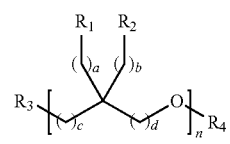  Formula 4

  Formula 5 in Formula 4 or 5, $R_1$, $R_2$, $R_3$, $R_4$, $R_5$, $R_6$, $R_7$ and $R_8$ are each independently a hydrogen atom; a hydroxyl group; a $C_{1-10}$ alkyl group; a $C_{3-10}$ cycloalkyl group; a $C_{6-15}$ aryl group; a $C_{2-30}$ alkyl group or a cycloalkyl group substituted with an acryloyl group, an acryloyloxy group; an epoxy group or a hydroxyl group; a vinyl group; an allyl group; an acryloyloxy group; an epoxy group; or a $C_{1-10}$ alkoxy group, at least one of which may include an acryl group, a, b, c, and d are about 0 or a natural number such that a+b+c+d is about 2 or more, n is about 1~about 5 and $R_1$ and $R_2$ are not identical to each other when n is larger than about 1, and e,f, g, and h are about 0 or a natural number such that e+f+g+h is about 2 or more.

When the crosslinking agent of example embodiments is used, Si—O—C and C—C bonds may be induced, together with Si—O—Si bonds between silane resins, by heat, therefore making it possible to prepare a solid film via the reaction with the crosslinking agent. The reason is that the crosslinking agent used may be highly reactive and hence may cause a crosslinking reaction in a relatively short time using heat or optical energy in the presence of a reactive group able to react therewith, thereby realizing a solid network structure. Because the reaction of the crosslinking agent, not only with a double bond, but also with a hydroxyl group (—OH), and further, the bonding between the crosslinking agents, may continuously occur, uncontrollable explosive reaction force is produced to thus enable the formation of a solid resin having a network structure, leading to a solid film which is resistant to general chemical solvents and physical stress.

The crosslinking agent may be used in an amount of about 0.001~about 100 parts by weight, for example, about 5~about 50 parts by weight based on about 100 parts by weight of the organic silane material. When the amount exceeds about 100 parts by weight, bubbles may be formed due to excessive reactivity, and consequently the quality of film may become undesirable. On the other hand, when the amount is less than about 0.001 parts by weight, the degree of crosslinking may be decreased and the resulting thin film may be damaged in subsequent processes.

Examples of the solvent used for the preparation of the composition of example embodiments may include an aliphatic hydrocarbon solvent, e.g., hexane, an aromatic hydrocarbon solvent, e.g., anisol, mesitylene and/or xylene, a ketone-based solvent, e.g., cyclohexanone, methyl isobutyl ketone, 1-methyl-2-pyrrolidinone and/or acetone, an ether-based solvent, e.g., tetrahydrofuran and/or isopropyl ether, an acetate-based solvent, e.g., ethyl acetate, butyl acetate and/or propyleneglycol methyl ether acetate, an alcohol-based solvent, e.g., isopropyl alcohol and/or butyl alcohol, an amide-based solvent, e.g., dimethylacetamide and/or dimethylformamide, a silicon-based solvent, water, and mixtures thereof.

The solvent, which should be present in a sufficient amount up to the concentration required to apply the organic silane material and the crosslinking agent on a substrate, may be used in an amount of about 20 wt %~about 99 wt %, for example, about 60 wt %~about 90 wt %, based on the total amount of the composition. If the amount of solvent is less than about 20 wt %, respective components may not be completely dissolved. On the other hand, if the amount exceeds about 99 wt %, the film may be formed at about 100 Å or thinner.

In addition, example embodiments provide a method of preparing an organic insulator, comprising applying the composition on a substrate and then curing the composition. As such, the application process may be performed through spin coating, dip coating, printing, spray coating, or roll coating, for example, spin coating. The curing process for forming the organic insulator may be performed by heating the substrate at about 70° C.~about 150° C. for a time period ranging from about 10 min to about 2 hours, radiating UV light (about 500 mJ/cm$^2$) onto the substrate, and then further heating the substrate at about 200° C. for about 1 hour.

The organic insulator thus prepared may have insulating properties, and the OTFT using the same may have increased charge mobility, a decreased operating voltage and threshold voltage, and an increased on-off ratio ($I_{on}/I_{off}$). While the insulating film of example embodiments may be more easily prepared through a typical wet process, e.g., printing or spin coating, performance thereof may be equal to that of an inorganic insulating film that may be prepared only using a complicated process, e.g., chemical deposition. In addition, example embodiments provide an OTFT comprising the organic insulator as an insulating layer.

The composition of example embodiments may be applied to a variety of OTFTs, including the structure of FIG. 1, within a range that does not inhibit the purpose of example embodiments. The substrate may be formed of a material, e.g., plastic, glass and/or silicon. The organic active layer may be formed of a typically known material, specific examples thereof including, but not being limited to, pentacene, copper phthalocyanine, polythiophene, polyaniline, polyacetylene, polypyrrole, polyphenylene vinylene, and derivatives thereof. The gate electrode and the source/drain electrodes may be formed of a typical metal, specific examples thereof including, but not being limited to, gold (Au), silver (Ag), aluminum (Al), nickel (Ni), and indium tin oxide (ITO).

Example embodiments also provide an electronic device comprising the organic thin film transistor of example embodiments. Because the organic insulator of example embodiments serves to improve the device characteristics of an organic thin film transistor, the organic insulator may be effectively used to fabricate a variety of electronic devices, including liquid crystal display (LCD) devices, photovoltaic devices, organic light-emitting devices (OLEDs), sensors, memory devices and/or integrated circuits. These electronic devices may be fabricated using the organic insulator of example embodiments by any common process.

Example embodiments also provide a method of fabricating an organic thin film transistor which may include forming a gate electrode, an insulating layer, an organic semiconductor layer, and a plurality of pairs of source/drain electrodes on a substrate, wherein the insulating layer is the organic insulator prepared according to example embodiments.

Example embodiments also provide a method of fabricating an electronic device that may include fabricating the organic thin film transistor according to example embodiments.

A better understanding of example embodiments may be obtained in light of the following examples, which are set forth to illustrate, but are not to be construed to limit example embodiments.

PREPARATIVE EXAMPLE 1

Synthesis of Methylvinylsiloxane (MVTS)

Methyl trimethoxysilane (about 30 g, about 220 mmol) and vinyl trimethoxysilane (about 6.53 g, about 44 mmol) were combined in a flask, and about 1 N HCl (about 0.79 ml) and water (about 47.55 ml) were slowly added thereto in an about −30° C. reaction bath. The reaction mixture was stirred at about room temperature for about 24 hours and then washed with a sufficient amount of water. The resultant organic layer was dried using magnesium sulfate (MgSO$_4$), filtered, and distilled under reduced pressure to remove the solvent, and dried in a vacuum, thus obtaining MVTS. FIG. 2 illustrates the chemical structure of the MVTS thus obtained, and FIG. 3 illustrates the spectrum of the MVTS measured using NMR spectroscopy (29Si NMR (400 MHz)).

PREPARATIVE EXAMPLE 2

Synthesis of Propylvinylsiloxane (PVTS)

Trimethoxysilyl propane (about 20 g, about 122 mmol) and vinyltrimethoxysilane (about 3.6 g, about 24 mmol) were combined in a flask, and about 1 N HCl (about 0.44 ml) and about 26 ml of water were slowly added thereto in an about −30° C. reaction bath. The reaction mixture was stirred at about room temperature for about 24 hours and then washed with a sufficient amount of water. The resultant organic layer was dried using magnesium sulfate (MgSO$_4$), filtered, and distilled under reduced pressure to remove the solvent, and dried in a vacuum, thus obtaining PVTS.

PREPARATIVE EXAMPLE 3

Synthesis of Methylallylsiloxane (MATS)

Methyl trimethoxysilane (about 30 g, about 220 mmol) and allyltrimethoxysilane (about 7.1 g, about 44 mmol) were combined in a flask, and about 1 N HCl (about 0.79 ml) and water (about 47.55 ml) were slowly added thereto in an about −30° C. reaction bath. The reaction mixture was stirred at about room temperature for about 24 hours and then washed with a sufficient amount of water. The resultant organic layer was dried using magnesium sulfate (MgSO$_4$), filtered, and distilled under reduced pressure to remove the solvent, and dried in a vacuum, thus obtaining MATS. FIG. 3 illustrates the chemical structure of the MATS thus obtained, and FIG. 5 illustrates the spectrum of the MATS measured using NMR spectroscopy (29Si NMR (400 MHz)).

EXAMPLE 1

About 0.2 g of the MVTS obtained in Preparative Example 1 and about 0.04 g of a crosslinking agent, dipentaerythritol penta-/hexa-acrylate (DPHA), were added to about 1 g of n-butanol and then mixed well, thus preparing a mixture for an organic insulator. On an Al/Nd gate pattern on a glass substrate, the mixture for an organic insulator was applied through spin coating to thus form a film, which was then subjected to pre-annealing at about 70° C. for about 2 min, UV irradiation (about 500 mJ/cm$^2$), and then baking at about 200° C. for about 1 hour, thereby forming an insulating layer. On the insulating layer thus formed, about 1 wt % polythiophene in chloroform was applied to a thickness of about 1000 Å through spin coating at about 2000 rpm, therefore forming a semiconductor layer. On the above active layer, source/drain electrodes were formed using gold (Au) metal through a top contact process with the use of a shadow mask having a channel length of about 100 µm and a channel width of about 1 mm, thereby manufacturing an OTFT.

EXAMPLE 2

An OTFT was manufactured in the same manner as in Example 1, with the exception that about 0.2 g of the PVTS obtained in Preparative Example 2 was used, instead of about 0.2 g of the MVTS.

EXAMPLE 3

An OTFT was manufactured in the same manner as in Example 1, with the exception that about 0.2 g of the MATS obtained in Preparative Example 3 was used, instead of about 0.2 g of the MVTS.

COMPARATIVE EXAMPLE 1

An OTFT was manufactured in the same manner as in Example 1, with the exception that about 1 g of a propyl methacrylate silane compound (TPM) was added to about 4 g of n-butanol and then mixed with about 0.15 g of titanium t-butoxide as a crosslinking agent.

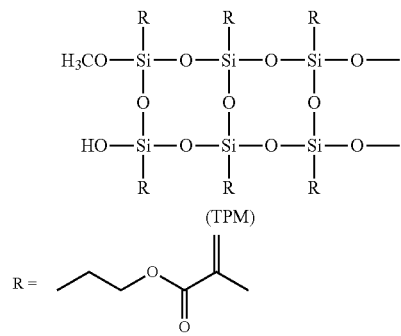

The current transfer properties of the OTFTs manufactured in Examples 1 to 3 and Comparative Example 1 were measured using a semiconductor characterization system (4200-SCS), available from KEITHLEY. The results are shown in FIGS. 6 to 9, and the electrical properties thereof are given in Table 1 below.

TABLE 1

| Composition | $I_{on}$ (A) | $I_{off}$ (A) | Mobility (cm$^2$/V · s) | Hysteresis (V) |
|---|---|---|---|---|
| MVTS/DPHA | $2.5 \times 10^{-7}$ | $1.5 \times 10^{-11}$ | 0.047 | 0 |
| PVTS/DPHA | $4.3 \times 10^{-7}$ | $4.2 \times 10^{-12}$ | 0.017 | 0.5 |
| MATS/DPHA | $1.5 \times 10^{-7}$ | $1.1 \times 10^{-13}$ | 0.012 | 1 |
| TPM/Ti (BuOH)$_4$ | $1 \times 10^{-5}$ | $5 \times 10^{-10}$ | 1 | 17 |

The charge mobility was calculated using the following current equation for the saturation region. That is, the current equation for the saturation region was converted into a graph of $(I_{SD})^{1/2}$ and $V_G$, and the charge mobility was calculated from the slope of the converted graph:

$$I_{SD} = \frac{WC_0}{2L}\mu(V_G - V_T)^2$$

$$\sqrt{I_{SD}} = \sqrt{\frac{\mu C_0 W}{2L}} (V_G - V_T)$$

$$\text{slope} = \sqrt{\frac{\mu C_0 W}{2L}}$$

$$\mu_{FET} = (\text{slope})^2 \frac{2L}{C_0 W}$$

wherein $I_{SD}$ is source-drain current, µ or $\mu_{FET}$ is charge mobility, $C_o$ is oxide film capacitance, W is the channel width, L is the channel length, $V_G$ is the gate voltage, and $V_T$ is the threshold voltage.

The off-current ($I_{off}$), which is current flowing in the off-state, was determined to be the minimum current in the off-state from the current ratio.

The on-current ($I_{on}$), which is current flowing in the on-state, was determined to be the maximum current in the on-state from the current ratio.

The hysteresis indicates a difference between threshold voltages upon forward and backward operations.

As is apparent from Table 1, the insulators of the OTFTs manufactured in Examples 1 to 3 exhibited the change in current flow that depended on the change in voltage forward ((+) to (−) voltage) being the same as that backward ((−) to (+) voltage), and thus there was no difference between the forward voltage change and the backward voltage change, resulting in a hysteresis value that was close to zero. Further, the crosslinked film was not deteriorated or dissolved by chemicals during the process.

As described hereinbefore, example embodiments provide a composition for preparing an organic insulator having a crosslinking property and an organic insulator prepared using the same. The organic insulator of example embodiments may be realized in the form of a solid insulating film, which may increase charge mobility while decreasing the threshold voltage and operating voltage of OTFTs and which also generates only slight hysteresis. Therefore, the organic insulator of example embodiments may be effectively applied to the fabrication of OTFTs.

Although example embodiments have been disclosed for illustrative purposes, those skilled in the art will appreciate that various modifications, additions and substitutions are possible, without departing from the scope and spirit of the accompanying claims.

What is claimed is:

1. A composition comprising:
   an organic silane material having a vinyl group or an acetylene group as a functional group for participating in a crosslinking reaction;
   a crosslinking agent; and
   a solvent for dissolving the organic silane material and the crosslinking agent,
   wherein the organic silane material is a siloxane compound obtained by hydrolyzing and condensing at least one organic silane compound alone, or mixtures thereof, selected from the group consisting of compounds represented by Formulas 1 to 3 below:

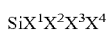

$SiX^1X^2X^3X^4$      Formula 1

$R^1Si\ X^1X^2X^3$      Formula 2

$R^1R^2Si\ X^1X^2$      Formula 3 in Formulas 1 to 3, $R^1$ and $R^2$ are each independently a hydrogen atom; a $C_{1-10}$ alkyl group; a $C_{3-10}$ cycloalkyl group; a $C_{6-15}$ aryl group; a $C_{2-30}$ alkyl group or a cycloalkyl group substituted with an acryloyl group, an acryloyloxy group or an epoxy group; a vinyl group; an allyl group; an acryloyloxy group; an epoxy group; or a $C_{1-10}$ alkoxy group, at least one of which includes a vinyl group, or an acetylene group, and
   $X^1,X^2,X^3$ and $X^4$ are each independently a halogen atom or a $C_{1-10}$ alkoxy group, at least one of which is a hydrolysable functional group.

2. The composition as set forth in claim 1, wherein the crosslinking agent is represented by Formula 4 or 5 below:

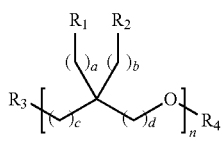

Formula 4

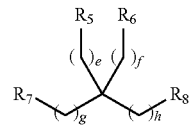

Formula 5 in Formulas 4 or 5, $R_1$, $R_2$, $R_3$, $R_4$, $R_5$, $R_6$, $R_7$ and $R_8$ are each independently a hydrogen atom; a hydroxyl group; a $C_{1-10}$ alkyl group; a $C_{3-10}$ cycloalkyl group; a $C_{6-15}$ aryl group; a $C_{2-30}$ alkyl group or a cycloalkyl group substituted with an acryloyl group, an acryloyloxy group, an epoxy group or a hydroxyl group; a vinyl group; an ally group; an acryloyloxy group; an epoxy group; or a $C_{1-10}$ alkoxy group, at least one of which include an acryl group,
   a, b, c, and d are about 0 or a natural number such that a+b+c+d is about 2 or more,
   n is about 1- about 5, and $R_1$ and $R_2$ are not identical to each other when n is larger than about 1, and
   e, f, g, and h are about 0 or a natural number, such that e+f+g+h is about 2 or more.

3. The composition as set forth in claim 1, wherein the solvent is an aliphatic hydrocarbon solvent, an aromatic hydrocarbon solvent, a ketone-based solvent, an ether-based solvent, an acetate-based solvent, an alcohol-based solvent, an amide-based solvent, a silicon-based solvent, or mixtures thereof.

4. The composition as set forth in claim 1, wherein the crosslinking agent is used in an amount of about 0.001~ about 100 parts by weight based on about 100 parts by weight of the organic silane material, and the solvent is used in an amount of about 20 wt %~ about 99 wt % based on a total amount of the composition.

5. An organic insulator, including the composition of claim 1.

6. An organic thin film transistor, comprising a substrate, a gate electrode, an insulating layer, an organic semiconductor layer, and a plurality of pairs of source/drain electrodes, wherein the insulating layer is the organic insulator of claim 5.

7. An electronic device comprising the organic thin film transistor of claim 6.

8. A method of preparing an organic insulator, comprising applying the composition of claim 1 on a substrate and then curing the composition.

9. The method as set forth in claim 8, wherein applying the composition is performed through spin coating, dip coating, printing, spray coating, or roll coating.

10. The method as set forth in claim 8, wherein curing is performed using light or heat.

11. A method of fabricating an organic thin film transistor, comprising:
    forming a gate electrode, an insulating layer, an organic semiconductor layer, and a plurality of pairs of source/drain electrodes on a substrate, wherein the insulating layer is the organic insulator prepared according to claim 8.

12. A method of fabricating an electronic device comprising fabricating the organic thin film transistor according to claim 11.

* * * * *